United States Patent
Bae

(10) Patent No.: US 6,853,593 B1
(45) Date of Patent: Feb. 8, 2005

(54) SEMICONDUCTOR MEMORY DEVICE HAVING OVER-DRIVING SCHEME

(75) Inventor: Seung-Cheol Bae, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 10/737,546

(22) Filed: Dec. 15, 2003

(30) Foreign Application Priority Data

Jul. 15, 2003 (KR) .................................. 10-2003-48253

(51) Int. Cl.[7] .............................................. G11C 7/00
(52) U.S. Cl. .................. 365/189.09; 365/205; 365/208
(58) Field of Search .............................. 365/203, 204, 365/205, 207, 208, 189.09

(56) References Cited

U.S. PATENT DOCUMENTS

| | | | |
|---|---|---|---|
| 5,315,556 A | | 5/1994 | Fukushi |
| 5,526,322 A | | 6/1996 | Lee |
| 5,544,110 A | | 8/1996 | Yuh |
| 5,841,706 A | | 11/1998 | Umezaki et al. |
| 6,115,316 A | * | 9/2000 | Mori et al. ............. 365/230.03 |
| 6,304,494 B1 | * | 10/2001 | Arimoto ................. 365/189.09 |
| 6,347,058 B1 | | 2/2002 | Houghton et al. |
| 6,487,133 B2 | * | 11/2002 | Wada et al. ................. 365/205 |
| 6,741,514 B2 | * | 5/2004 | Sako ........................... 365/205 |
| 6,754,122 B2 | * | 6/2004 | Wada et al. ................. 365/207 |
| 2001/0048625 A1 | | 12/2001 | Patti et al. |

* cited by examiner

Primary Examiner—Son Mai
(74) Attorney, Agent, or Firm—Blakely Sokoloff Taylor & Zafman

(57) ABSTRACT

A semiconductor memory device has an over-driving scheme through which it is possible to perform effective over-driving regardless of the fluctuation of manufacturing and driving environment. The semiconductor memory device includes a first power supplying block for providing a normal voltage, a first driving block for driving a power line of a bit-line amplifier with a voltage on a connection node attached to the first power supplying block, a second driving block for driving the connection node with a voltage higher than the normal voltage, and a control block for generating an over-driving control signal which controls the second driving block by detecting a level of the voltage on the connection node to that of a preset reference voltage.

6 Claims, 3 Drawing Sheets

SEMICONDUCTOR MEMORY DEVICE HAVING OVER-DRIVING SCHEME

FIELD OF THE INVENTION

The present invention relates to semiconductor design technology; and, more particularly, to a semiconductor memory device having an over-driving scheme.

DESCRIPTION OF RELATED ART

As a low driving voltage is used to implement the low power of a memory device, various technical supplements have been used to improve the operation of a sense amplifier in the memory device such as a dynamic random access memory (DRAM). One of such supplements is an over-driving scheme of the sense amplifier.

In general, if data of a plurality of memory cells are transferred onto bit-lines, wherein the memory cells are connected to a certain word-line activated by a row address, a bit-line sense amplifier senses and amplifies a voltage difference between corresponding two bit-lines constructing a bit-line pair.

In the above process, since thousands of bit-line sense amplifiers start to operate simultaneously, a driving time of the bit-line sense amplifiers is determined according to whether or not it is possible to supply a sufficient amount of current as much as driving the bit-line sense amplifiers.

However, since the operating voltage is lowered according to a trend of the low power of the memory device, it is difficult to supply the sufficient current in a moment. To overcome that kind of obstacle, the over-driving scheme is adopted so as to instantly supply a voltage higher than a normal voltage, i.e., internal core voltage, onto a power line RTO of the bit-line sense amplifier at an initiative operating period of the bit-line sense amplifier (immediately after the charge sharing between a cell and a bit-line).

In FIG. 1, there is provided a block diagram of a semiconductor memory device having a conventional over-driving scheme.

Referring to FIG. 1, the semiconductor memory device includes a memory cell array block 10, a bit-line sense amplifier array block 12 for sensing and amplifying voltage differences of bit-line pairs of the memory cell array block 10, a driver PM2 for driving a power line RTO with a voltage on a connection node N1 attached to a core power supply terminal Vcore in response to a driving control signal SAP, a pulse generating unit 11 for producing an over-driving enable signal over_enb based on an over-driving startup signal over_on, and an over-driver PM1 for driving the connection node N1 with an external voltage Vdd which is higher than the internal core voltage Vcore. Meanwhile, a separate driver is employed to drive a power line SB of the bit-line sense amplifier array block 12 with a ground voltage Vss.

FIG. 2 shows a detailed circuit diagram of the pulse generating unit 11 in FIG. 1.

Referring to FIG. 2, the pulse generating unit 11 includes a delay sector 20 for delaying the over-driving startup signal over_on for a constant time and inverting the delayed signal to thereby output a signal over_onb_dl, and a NAND gate ND1 for generating the over-driving enable signal over_enb based on the over-driving startup signal over_on and an output signal over-onb_dl of the delay sector 20.

The delay sector 20 can be implemented with an inverter chain consisting of inverters I1, I2 and I3 by using the over-driving startup signal over_on as an input. That is, the output signal over-onb_dl of the delay sector 20 is an inverted signal delayed by a delay time of the inverter chain compared to the over-driving startup signal over_on.

FIG. 3 describes a waveform diagram showing the operation of the circuit in FIG. 1.

Hereinafter, with reference to FIG. 3, there will be explained the operation of the circuits in FIGS. 1 and 2.

First of all, if a word-line WL is activated, data of memory cells in the memory cell array block 10 corresponding to the word-line WL are transferred onto bit-lines, e.g., BL and /BL.

Then, if the driving control signal SAP and the over-driving startup signal over_on are actuated, the driver PM2 drives the power line RTO of the bit-line sense amplifier with the voltage of the connection node N1 in response to the driving control signal SAP. At this time, the power line RTO is driven by a voltage higher than the internal core voltage Vcore.

In the meantime, the delay sector 20 delays the over-driving startup signal over_on by a fixed time and inverts the delayed signal to thereby produce the signal over_onb_dl. The NAND gate ND1 is coupled with the over-driving startup signal over_on and the signal over_onb_dl outputted from the delay sector 20 to thereby generate the over-driving enable signal over_enb having a pulse width which corresponds to the delay time of the delay sector 20. Namely, the pulse width of the over-driving enable signal over_enb determines the driving time of the over-driver PM1.

Subsequently, as becoming the over-driving enable signal over_enb inactivated, the power line RTO of the bit-line sense amplifier is driven by the internal core voltage Vcore and the data restoring is accomplished during this period.

After then, the word-line WL is inactivated and the over-driving startup signal over_on and the driving control signal SAP are disabled. The bit-lines BL and /BL are precharged.

As described above, since the conventional pulse generating unit 11 for producing the over-driving enable signal over_enb has an activated time corresponding to the delay time of the delay sector 20, the over-driving period is always maintained to have a constant time.

However, if the over-driving period is maintained constantly as shown above, there are required lots of modifications and repeated tests for a metal layer. Therefore, if the driving time of the over-driver PM1 is short, it is difficult to increase the driving voltage of the bit-line sense amplifier to a sufficient voltage level, so that the driving time of the bit-line sense amplifier cannot be improved. On the other hand, if the driving time is long, a level of the driving voltage of the bit-line sense amplifier is substantially increased, resulting in a bad effect on a high margin of data. As a result, to find an appropriate over-driving time, lots of modifications and repeated tests are required for the metal layer. This leads high cost and time consumption.

Meanwhile, although the appropriate driving time was determined through the repeated modifications and tests, it is difficult to get an expected effect by the fluctuation of driving and manufacturing environment of the memory device.

SUMMARY OF THE INVENTION

It is, therefore, an object of the present invention to provide a semiconductor memory device having an over-driving scheme capable of performing effective over-driving regardless of the fluctuation of manufacturing and driving environment.

In accordance with an aspect of the present invention, there is provided a semiconductor memory device including a first power supplying block for providing a normal voltage, a first driving block for driving a power line of a bit-line amplifier with a voltage on a connection node attached to the first power supplying block, a second driving block for driving the connection node with a voltage higher than the normal voltage, and a control block for generating an over-driving control signal which controls the second driving block by detecting a level of the voltage on the connection node to that of a preset reference voltage.

In accordance with the present invention, an over-driver controlled by sensing a voltage level compares a voltage level of a power line with that of a reference voltage (ascending limit of the power line) and is enabled during the voltage level of the power line is lower than that of the reference voltage. By driving the over-driver through the voltage level sensing, there are not required the repeated modifications and test processes for the metal layer. Furthermore, the effective over-driving can be performed without being influenced by the fluctuation of the manufacturing and driving environment.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Hereinafter, a preferred embodiment of the present invention will be described in detail with reference to the accompanying drawings.

Figure 1:
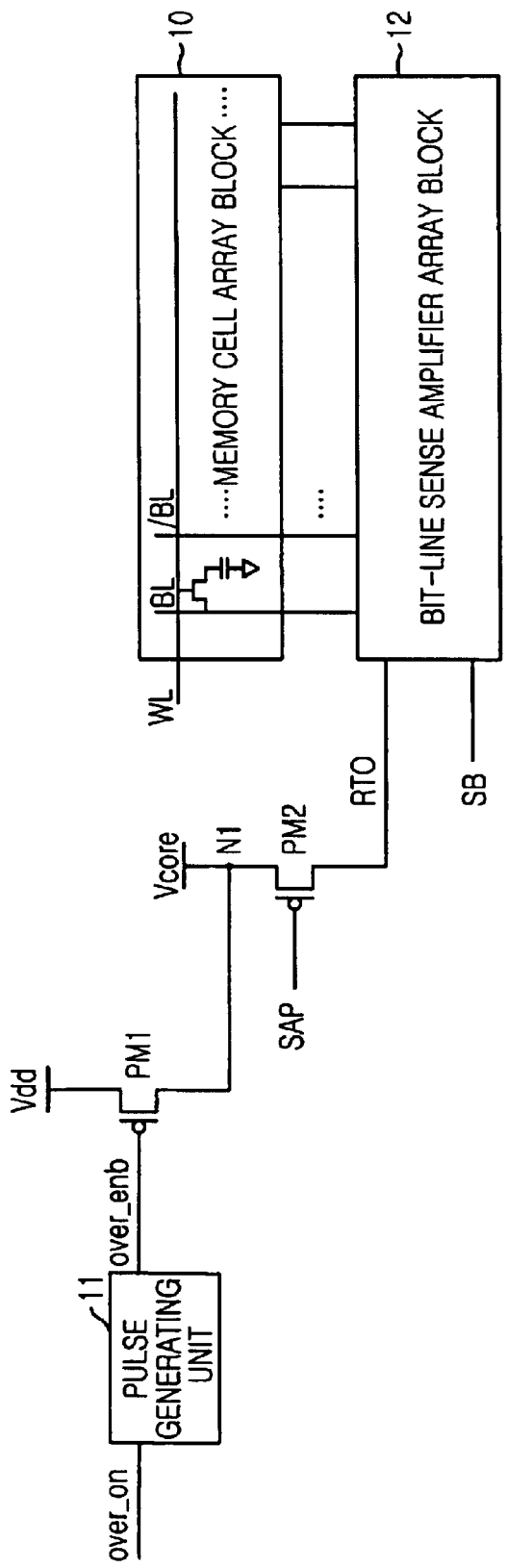
FIG. 1 is a block diagram of a semiconductor memory device having a conventional over-driving scheme.
Figure 2:
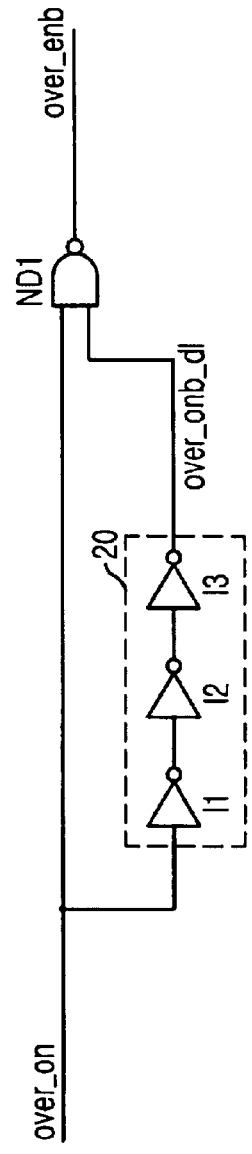
FIG. 2 shows a detailed circuit diagram of a pulse generating unit in FIG. 1.
Figure 3:
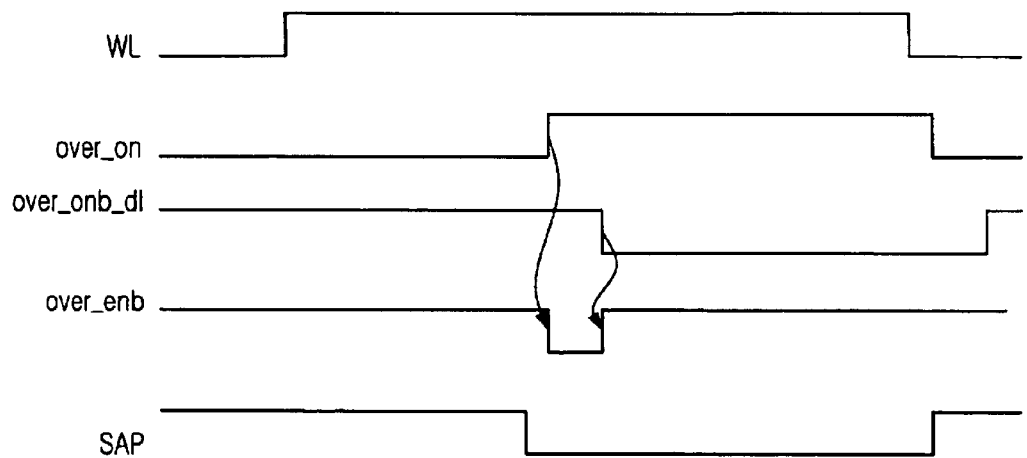
FIG. 3 describes a waveform diagram showing the operation of circuits in FIGS. 1 and 2.
Figure 4:
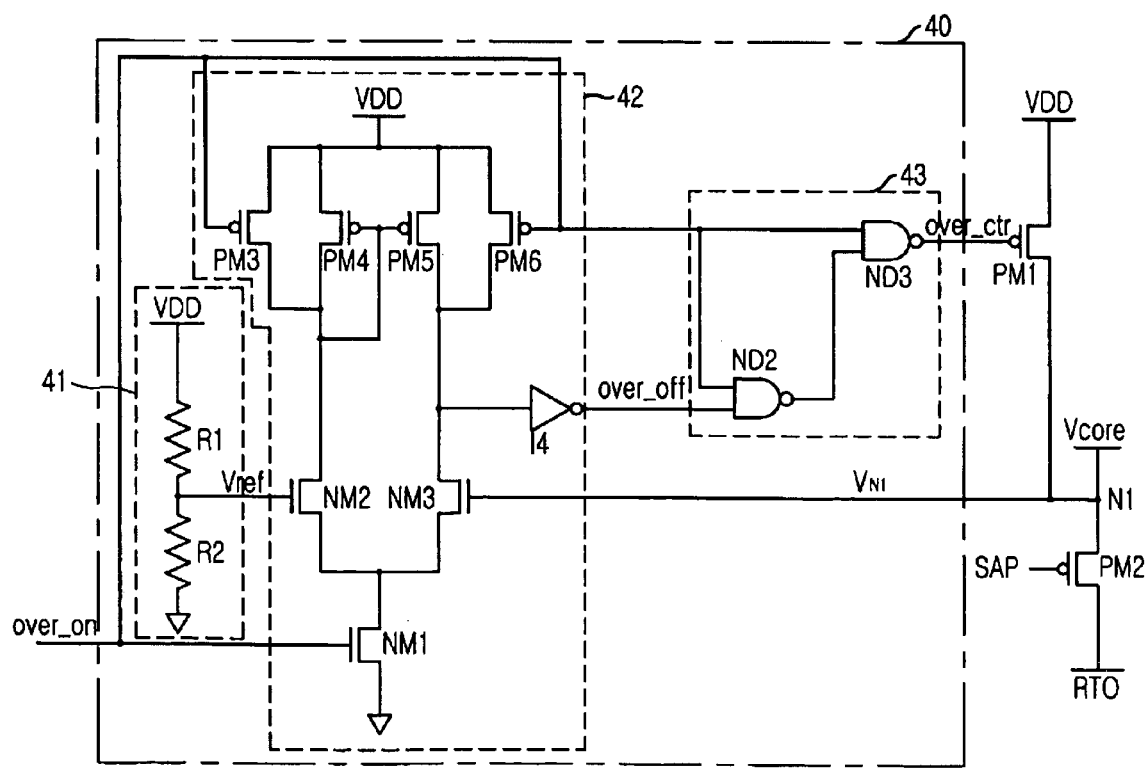
FIG. 4 provides a circuit diagram of a semiconductor memory device having an over-driving scheme in accordance with the present invention.

In FIG. 4, there is provided a circuit diagram of a semiconductor memory device having an over-driving scheme in accordance with an embodiment of the present invention.

Referring to FIG. 4, the inventive semiconductor memory device includes a driver PM2 for driving a power supply line RTO of a bit-line sense amplifier with a voltage VN1 on a connection node N1 attached to a core power supply terminal Vcore, a control unit 40 for generating an over-driving control signal over_ctr by detecting a level of the voltage $V_{N1}$ to that of a preset reference voltage Vref, and an over-driver PM1 for driving the connection node N1 with an external voltage VDD in response to the over-driving control signal over_ctr.

The control unit 40 contains a reference voltage generating sector 41 for producing the reference voltage Vref which is an ascending limit of the voltage $V_{N1}$ of the connection node N1, a voltage level detecting sector 42 for generating an over-driver off signal over_off by comparing the reference voltage Vref with the voltage $V_{N1}$ in response to an over-driving startup signal over_on, and a pulse generating sector 43 for producing the over-driving control signal over_ctr based on the over-driver off signal over_off and the over-driving startup signal over_on.

The reference voltage generating sector 41 produces the reference voltage Vref through the voltage dividing performed by using two resistors R1 and R2 serially connected between a ground voltage and the external voltage VDD higher than the internal core voltage Vcore. The reference voltage Vref is lower than the external voltage VDD and higher than the internal core voltage Vcore.

The voltage level detecting sector 42 has a current source transistor NM1 for providing a bias voltage to differential input transistors NM2 and NM3 based on the over-driving startup signal over_on, the differential input transistors NM2 and NM3 connected to the current source transistor NM1 and coupled with differential inputs, i.e., the reference voltage Vref and the connection node voltage $V_{N1}$, respectively, a current mirror consisting of transistors PM4 and PM5 coupled to the differential input transistors NM2 and NM3, respectively, pre-charge transistors PM3 and PM 6 for pre-charging drains of the differential input transistors NM2 and NM3 by receiving the over-driving startup signal over_on as their gate input, and an inverter 14 for inverting a signal outputted through the drain of the transistor NM3 whose gate is coupled with the connection node voltage $V_{N1}$.

The pulse generating sector 43 has a NAND gate ND2 for logically combining the over-driving startup signal over_on and the over-driver off signal over_off, and a NAND gate ND3 for logically combining the over-driving startup signal over_on and an output signal of the NAND gate ND2.

Meanwhile, it is preferable that the over-driver PM1 is implemented with a PMOS transistor whose gate receives the over-driving control signal over_ctr, source is connected to the external voltage VDD and drain is attached to the connection node N1. The driver PM2 is implemented with a PMOS transistor whose gate is coupled with a driving control signal SAP, source is connected to the connection node N1 and drain is attached to the power line RTO of the bit-line sense amplifier.

Figure 5:
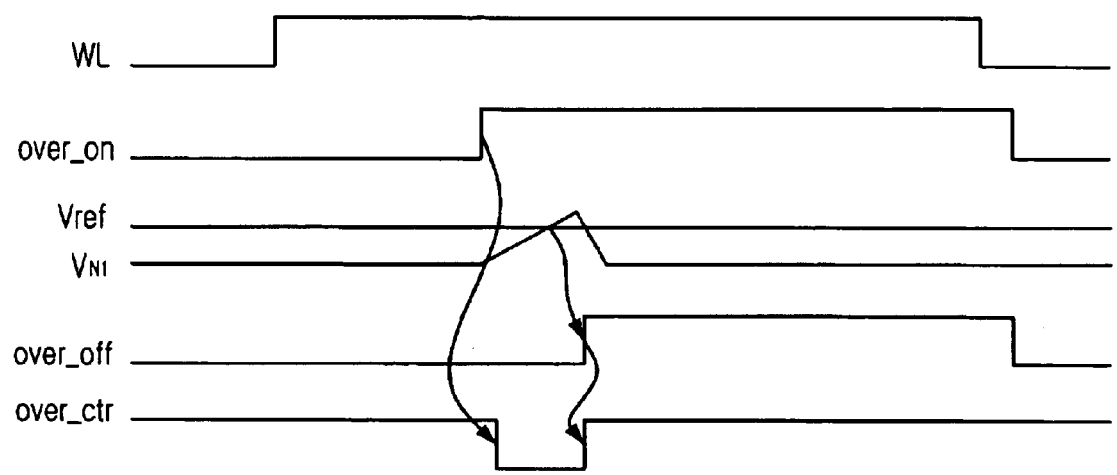
FIG. 5 represents a waveform diagram showing the operation of the circuit in FIG. 4.

FIG. 5 represents a waveform diagram showing the operation of the circuit in FIG. 4.

If a word-line WL is activated, data of memory cells corresponding to the word-line WL are transmitted onto bit-lines and, as a result, there occurs a delicate voltage difference between corresponding bit-lines in each bit-line pair (this is called charge-sharing).

At this time, since the connection node N1 maintains a voltage level identical to that of the internal core voltage Vcore, the over-driver off signal over_off is in a logic low state.

Then, if the over-driving startup signal over_on is actuated to a logic high state (simultaneously, the signal SAP is also activated to a logic low state although it is not shown), the over-driving control signal over_ctr is enabled to a logic low state, making the over-driver PM1 turned-on and, as a result, the level of the connection node voltage $V_{N1}$ starts to ascend. That is, the power line RTO of the bit-line sense amplifier is driven by the ascending connection node voltage $VN_1$.

In the meantime, if the connection node voltage $V_{N1}$ continuously ascends to a level higher than the reference voltage Vref, the voltage level detecting sector 42 detects it and, thus, the over-driver off signal over_off is activated to a logic high state. Furthermore, the over-driving control signal over_ctr is inactivated to a logic high state. If the over-driving control signal over_ctr is disabled, the over-driver PM1 is turned-off and the power line RTO of the bit-line sense amplifier is driven by the internal core voltage Vcore.

After then, the processes of bit-line sensing and amplification, and restoring are performed and, sequentially, the word-line is inactivated.

As described above, in accordance with the present invention, the over-driving period is decided by sensing the voltage level of the connection node N1. Since the over-driving period is varied by the fluctuation of memory environment, manufacturing processes and so on, the inventive device determines the over-driving period by considering the above factors and, thus, it is possible to maintain an optimized over-driving period without a separate test process or repeated modifications for a metal layer.

Although the voltage level detecting sector 42 is implemented with an NMOS type differential amplifier in accordance with the preferred embodiment of the present invention, it can be implemented with a PMOS type differential amplifier in accordance with another embodiment.

In addition, the present invention is applicable when the pulse generating sector 43 is implemented with other logic gates instead of the NAND gates shown in FIG. 4.

By determining an optimized over-driving period through the use of the present invention, it is possible to have advantages of improving the operating performance of the semiconductor memory device, and not requiring separate test processes or repeated modifications for the metal layer, resulting in reducing manufacturing cost and time.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor memory device comprising:
   a first power supplying means for providing a normal voltage;
   a first driving means for driving a power line of a bit-line amplifier with a voltage on a connection node attached to the first power supplying means;
   a second driving means for driving the connection node with a voltage higher than the normal voltage; and
   a control means for generating an over-driving control signal, which controls the second driving means by detecting a level of the voltage on the connection node to that of a preset reference voltage.

2. The semiconductor memory device as recited in claim 1, wherein the control means includes:
   a reference voltage generating means for producing the reference voltage;
   a voltage level detecting means for comparing the level of the voltage on the connection node with that of the reference voltage and outputting a comparison result signal under the control of an over-driving startup signal; and
   a pulse generating means for outputting the over-driving control signal, which is a pulse signal activated during an over-driving period in response to the over-driving startup signal and the comparison result signal outputted from the voltage level detecting means.

3. The semiconductor memory device as recited in claim 2, wherein the voltage level detecting means has:
   a current source transistor whose gate is coupled with the over-driving startup signal;
   a differential input transistor unit, connected to the current source transistor, for receiving the reference voltage and the voltage on the connection node as differential inputs;
   a current mirror connected to the differential input transistor unit; and
   an inverter attached to an output node of the current mirror.

4. The semiconductor memory device as recited in claim 3, wherein the pulse generating means has:
   a first NAND gate receiving the over-driving startup signal and an output signal of the inverter as inputs; and
   a second NAND gate receiving the over-driving startup signal and an output signal of the first NAND gate as inputs.

5. The semiconductor memory device as recited in claim 2, wherein the reference voltage generating means contains a voltage divider connected between a ground voltage and a voltage higher than the normal voltage.

6. The semiconductor memory device as recited in claim 1, wherein the normal voltage is an internal core voltage and the voltage higher than the normal voltage is an external power voltage.

* * * * *